United States Patent
Watanabe et al.

(10) Patent No.: US 7,247,410 B2
(45) Date of Patent: Jul. 24, 2007

(54) COMPLEMENTARY DIVISION MASK, METHOD OF PRODUCING MASK, AND PROGRAM

(75) Inventors: Yoko Watanabe, Kanagawa (JP); Shinji Omori, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/885,822

(22) Filed: Jul. 7, 2004

(65) Prior Publication Data

US 2005/0008948 A1    Jan. 13, 2005

(30) Foreign Application Priority Data

Jul. 8, 2003    (JP) .......................... P2003-193722

(51) Int. Cl.
  *G03F 1/00*    (2006.01)
  *G03C 5/00*    (2006.01)

(52) U.S. Cl. ............................. 430/5; 430/30

(58) Field of Classification Search ................ 430/5, 430/30, 296, 322–324, 396; 716/19
See application file for complete search history.

(56) References Cited

U.S. PATENT DOCUMENTS

| | | | |
|---|---|---|---|
| 6,180,289 B1 * | 1/2001 | Hirayanagi | 430/5 |
| 6,322,956 B1 * | 11/2001 | Tanioka et al. | 430/327 |
| 6,830,852 B2 * | 12/2004 | Kawata et al. | 430/5 |
| 6,855,467 B2 * | 2/2005 | Amemiya | 430/30 |
| 7,010,434 B2 * | 3/2006 | Ashida et al. | 702/33 |

2001/0028984 A1    10/2001    Yamashita et al.

FOREIGN PATENT DOCUMENTS

EP    1 233 443    8/2002

OTHER PUBLICATIONS

Kohichi Nakayama et al.; Complementary Splitting with Stress Emulation for Stencil Masks; Conference: Photomask and Next-Generation Lithography Mask Technology X; Yokohama, Japan; Proceedings of the SPIE, vol. 5130, No. 1, Apr. 16, 2003, pp. 979-989.

Hideo Namatsu et al; Dimensional limitations of silicon nanolines resulting from pattern distortion due to surface tension of rinse water; Applied Physics Letters, vol. 66, No. 20, May 15, 1995, pp. 2655-2657.

I. Ashida et al.; Data processing for LEEPL mask: Splitting and placement correction; Proceedings of the SPIE—The International Society for Optical Engineering; vol. 4754, 200s, pp. 847-856; XP00235711U, 2002.

European Search Report dated Apr. 7, 2006.

* cited by examiner

*Primary Examiner*—S. Rosasco
(74) *Attorney, Agent, or Firm*—Sonnenschein Nath & Rosenthal LLP (57) ABSTRACT

A complementary division method able to suppress a pattern deformation by wet washing, having the steps of determining a definite division length able to suppress the pattern deformation when wet washing to a width and distance of a pattern that is assumed the pattern deformation over an elasticity limit is easiest given by wet washing in advance, dividing the entire line-and-space patterns at the determined division length in the longitudinal direction to divide suitably the line-and-space pattern by a simple algorithm, and further providing a method of producing a mask and program.

11 Claims, 11 Drawing Sheets

COMPLEMENTARY DIVISION MASK, METHOD OF PRODUCING MASK, AND PROGRAM

BACKGROUND OF THE INVENTION

1. Field of the Invention

The present invention relates to a complementary division method, a method of producing a mask, and a program, in particular a complementary division method utilized to a pattern formation of a stencil mask used for a lithography process of a semiconductor device, a method of producing a mask, and a program.

2. Description of the Related Art

As a next generation exposure technology instead of photolithography, a projection exposure technology using electron beam has been developed. The projection exposure technology has an electron projection lithography (EPL) technology using accumulated electron beam of around 100 kV to form a mask pattern enlarged with a device pattern at the constant times on a mask similarly to photolithography and use, and a low energy beam proximity projection lithography (LEEPL) technology using low energy electron beam of around 2 kV to form a mask pattern having same time as a device pattern on a mask and use.

H. C. Pfeiffer, *Jpn. J. Appl. Phys.* 34, 6658 (1995) discloses masks used in the above exposure technology that mask differs from a photomask, is formed on it with a thin film region (membrane) of around 0.1 to 10 μm, and formed on that with a mask pattern as apertures. And these membrane materials have been proposed with silicon, silicon carbonate, and silicon nitride.

In the stencil mask, a pattern having unaperture portions in the middle portion like the doughnut shaped pattern will come out and cannot be formed. Therefore, the pattern has to be divided into a plurality of complementary patterns, formed with the respective pattern at the other portion on the mask or at the another mask, and exposed at several times so as to connect the respective complementary patterns at a wafer.

Figure 1A:
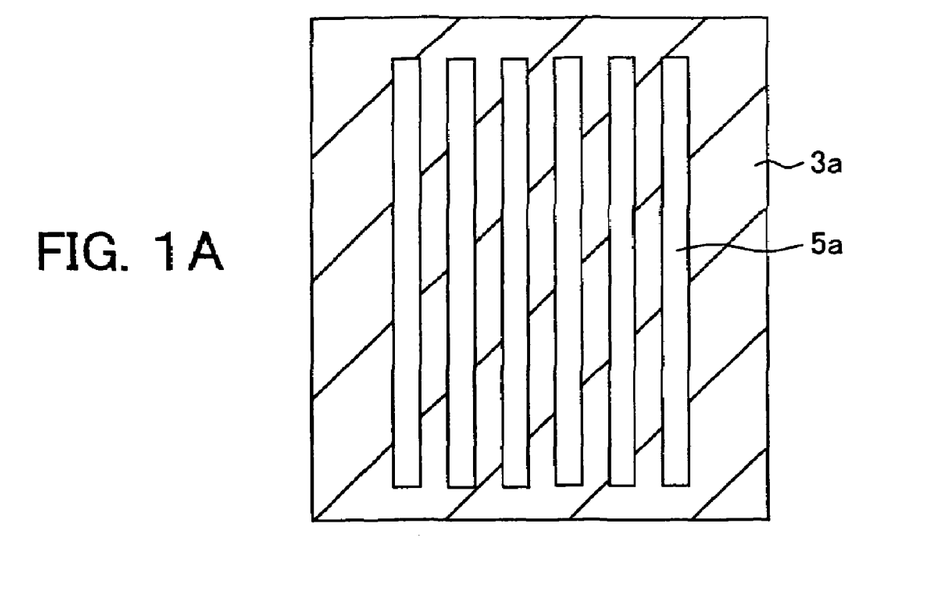
FIG. 1A and FIG. 1B are views for explaining a disadvantage according to the related art.
Figure 1B:
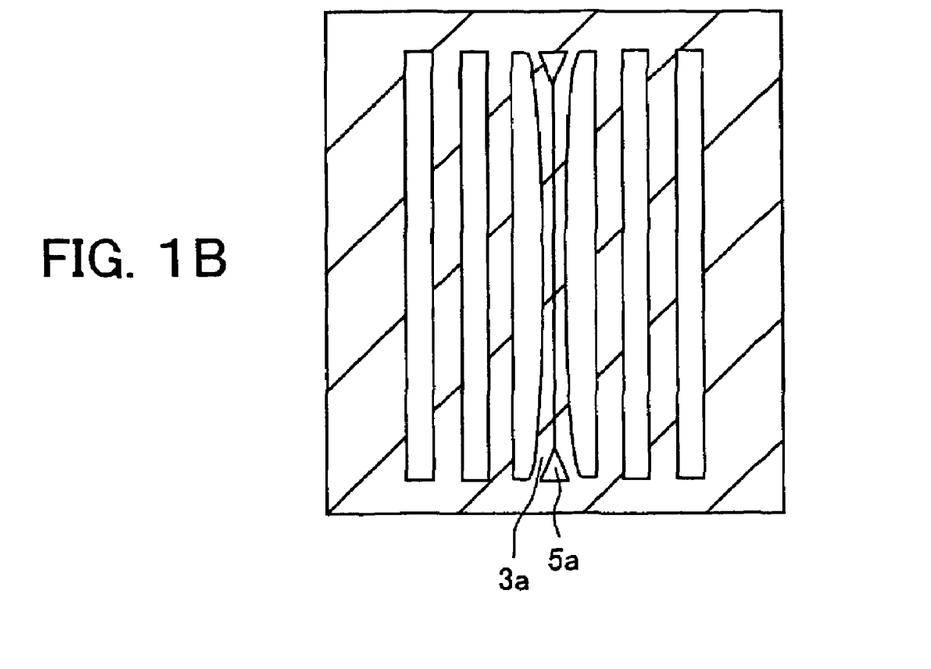

However, as shown in FIG. 1A, when a thin film 3a is formed with apertures 5a of line-and-space (L/S) patterns and then wet washed, the thin film (struts) between the apertures 5a is loaded such that the struts contact the adjoining struts (beams) when washing. As a result, it suffers from the disadvantage in that the respective adjusting struts deform and do not return to their original formations, as shown in FIG. 1B.

Japanese Unexamined Patent Application No.2001-274072 discloses a technology considering a pattern deformation by washing that the pattern is divided into grid portions having defined dimension. However, it has been a disadvantage that a complimentary division algorithm is complicated. And Japanese Unexamined Patent Application No. 2001-274072 discloses an example of the line-and-space pattern, however a division rules thereof is not disclosed.

SUMMARY OF THE INVENTION

An object of the present invention is to provide a complementary division method able to form a division pattern able to suppress a pattern deformation by wet washing, a method of producing a mask, and a program.

To achieve the above object, according to a first aspect of the present invention, there is provided a complementary division method for dividing a pattern comprising apertures formed at a mask, having a step of dividing the pattern to be divided at a division length able to suppress a pattern deformation when wet washing, in the longitudinal direction of the pattern.

According to a second aspect of the invention, there is provided a method of producing a mask having the steps of sampling a pattern to be divided from a designed pattern and dividing the sampled pattern to be divided by a division length able to suppress a pattern deformation in the longitudinal direction of the pattern when wet washing, distributing the divided patterns to difference regions to determine an arrangement of the divided patterns, forming apertures of the divided patterns based on the determined arrangement of the divided patterns at the different regions of a mask blanks, and wet-washing a mask formed with the apertures.

According to a third aspect of the invention, there is provided a program processed in a computer for making a complementary division process for dividing a pattern comprising apertures formed at a mask, wherein a division length of the pattern is determined according to a width and distance of the pattern, the division length being defined as that the maximum stress loaded to a film between the pattern is not over an elasticity limit of the film when wet washing, the program comprising the following steps processed by the computer sampling a pattern to be divided from a designed pattern, determining the division length according to the width and distance of the pattern, and dividing the sampled pattern to be divided by the determined division length in the longitudinal direction of the pattern.

According to a fourth-aspect of the invention, there is provided a program processed in a computer making a complementary division process dividing a pattern comprising apertures formed at a mask, wherein a division length of a pattern having the smallest width and distance in the pattern to be divided is determined, the division length being defined as that the maximum stress loaded to a film between the patterns is not over an elasticity limit of the film when wet washing, the program comprising the following steps processed by the computer of sampling the pattern to be divided from a designed pattern, and dividing the sampled pattern to be divided by the division length in the longitudinal direction.

BRIEF DESCRIPTION OF THE DRAWINGS

These and other objects and features of the present invention will be described in more detail with reference to the accompanying drawings, in which:

FIG. 2B is a perspective view enlarged with a part of that;

DESCRIPTION OF THE PREFERRED EMBODIMENTS

Next, preferred embodiment of the present invention will be explained with reference to the drawings.

First Embodiment

Figure 2A:
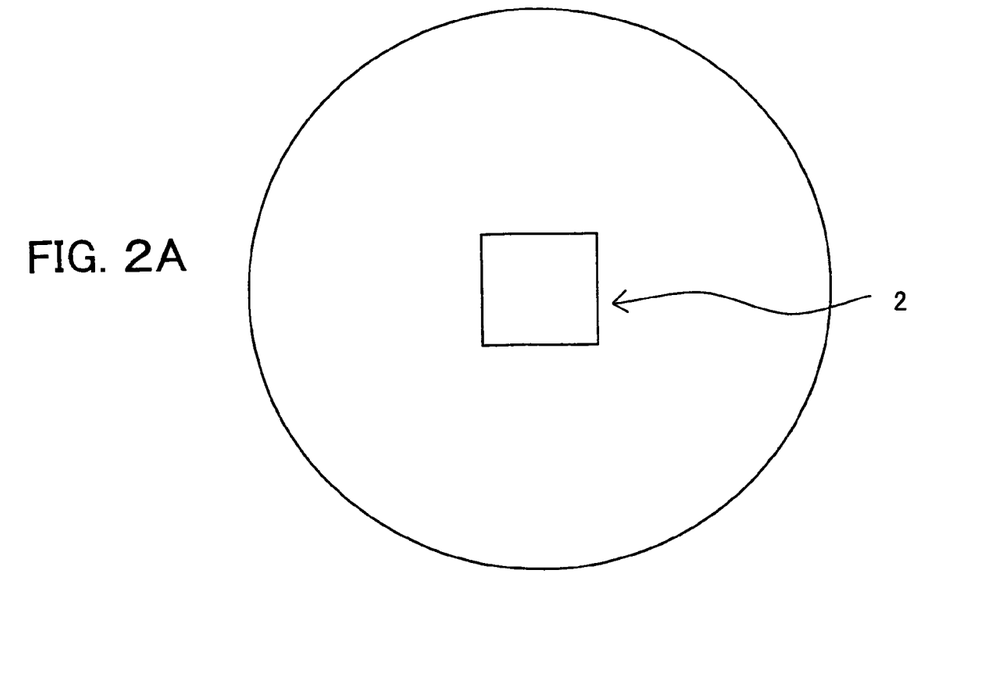
FIG. 2A is a plane view of a stencil mask produced by a method of producing a stencil mask according to the present embodiment.
Figure 2B:
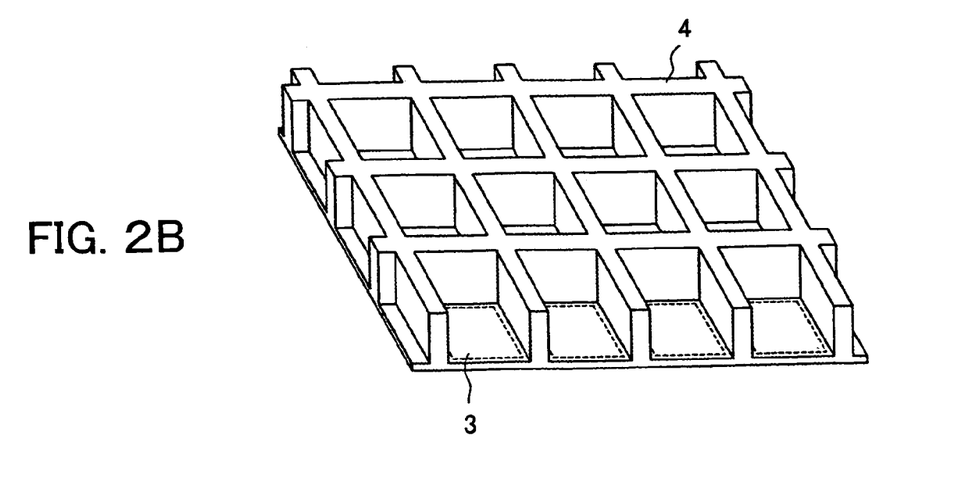

FIG. 2A is a plane view of a stencil mask produced by a method of producing a mask according to the present embodiment, while FIG. 2B is a perspective view enlarged with an exposure region.

As shown in FIG. 2A, the stencil mask is arranged with an exposure region 2 irradiated with X-ray, ion beam, or electron beam at a middle portion of a substrate in disk shape for example. As shown in FIG. 2B, a thin film having a thickness of around 100 nm to 10 μm (hereinafter called as a "membrane") is formed with a not shown aperture pattern. The exposure region 2 is formed with a reinforcement portion 4 having a large thickness for reinforcing strength of the thin membrane 3. A region divided by the reinforcement portion 4 becomes a region enabling pattern formation. The above stencil mask is made by an SOI wafer for example, and the thickness of the reinforcement portion 4 is a similarly to the thickness of an 8-inch silicon wafer substrate, for example, about 725 μm.

Figure 3:
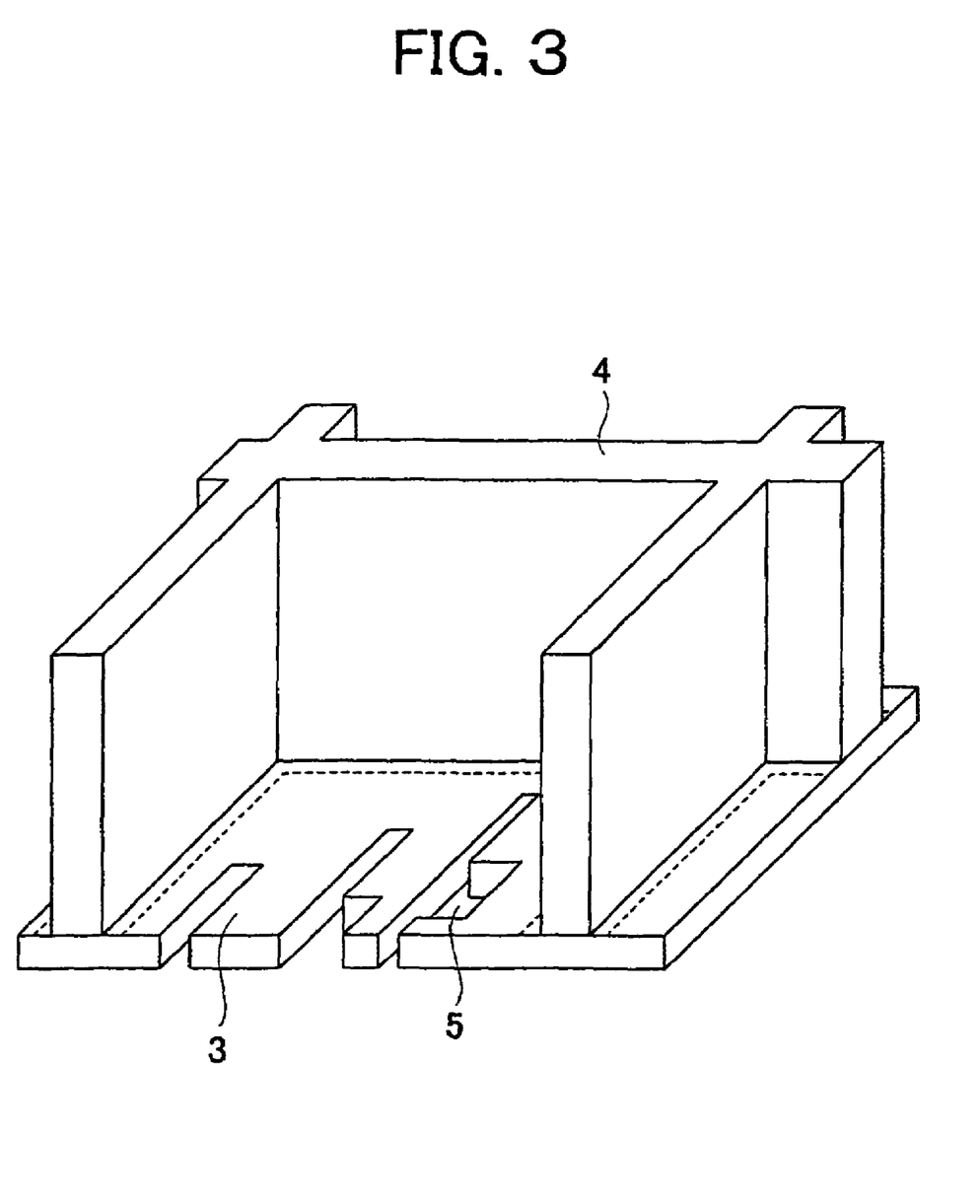
FIG. 3 is a perspective view enlarged with a region enabling a pattern formation of the stencil mask.

FIG. 3 is a perspective view enlarged with a region enabling pattern formation. The apertures 5 corresponding to the pattern are not formed at the reinforcement portion 4, but are formed at the membrane 3 of the region enabling pattern formation. In the stencil mask, the pattern is constituted by the apertures 5, so the pattern such as a doughnuts pattern unable to support its middle portion cannot be formed in this shape.

Figure 4:
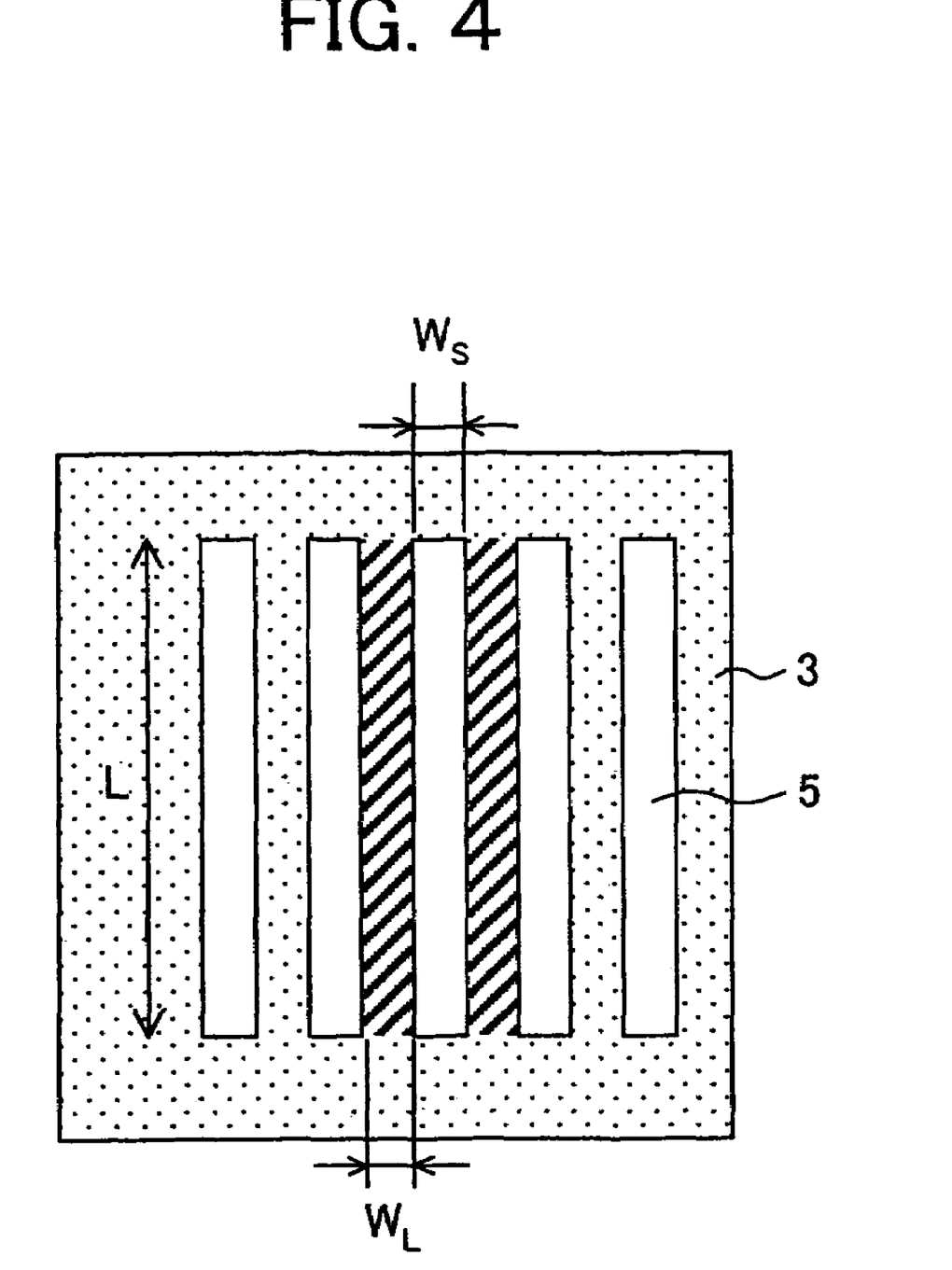
FIG. 4 is a plane view of a line-and-space pattern.

FIG. 4 is a plane view of a line-and-space pattern. If the apertures 5 of the line-and-space pattern are formed at the membrane 3, the strength of the membrane 3 drops and the washing destruction may be occurring. Due to this, the pattern like this is not applied to form in this shape. Therefore, not only the above doughnut pattern but also line-and-space pattern are carried out with a suitable division process, and have to be distributed and arranged on a mask.

Figure 5:
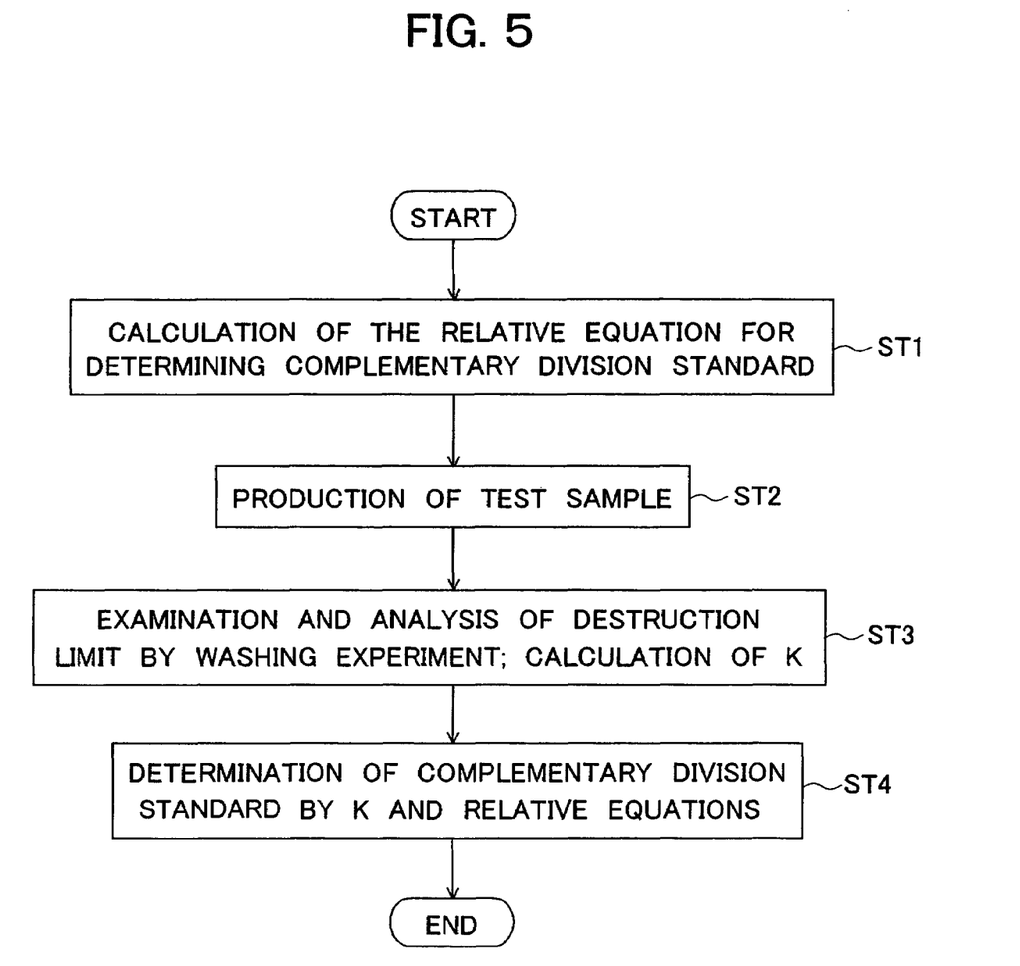
FIG. 5 is a flow chart for determining a complementary division standard of the line-and-space pattern.

The present embodiment will be explained with a complementary division method of a pattern to be divided, in particular, the line-and-space pattern. FIG. 5 is a flow chart for determining a complementary division standard of the line-and-space pattern.

Step ST1

Figure 6:
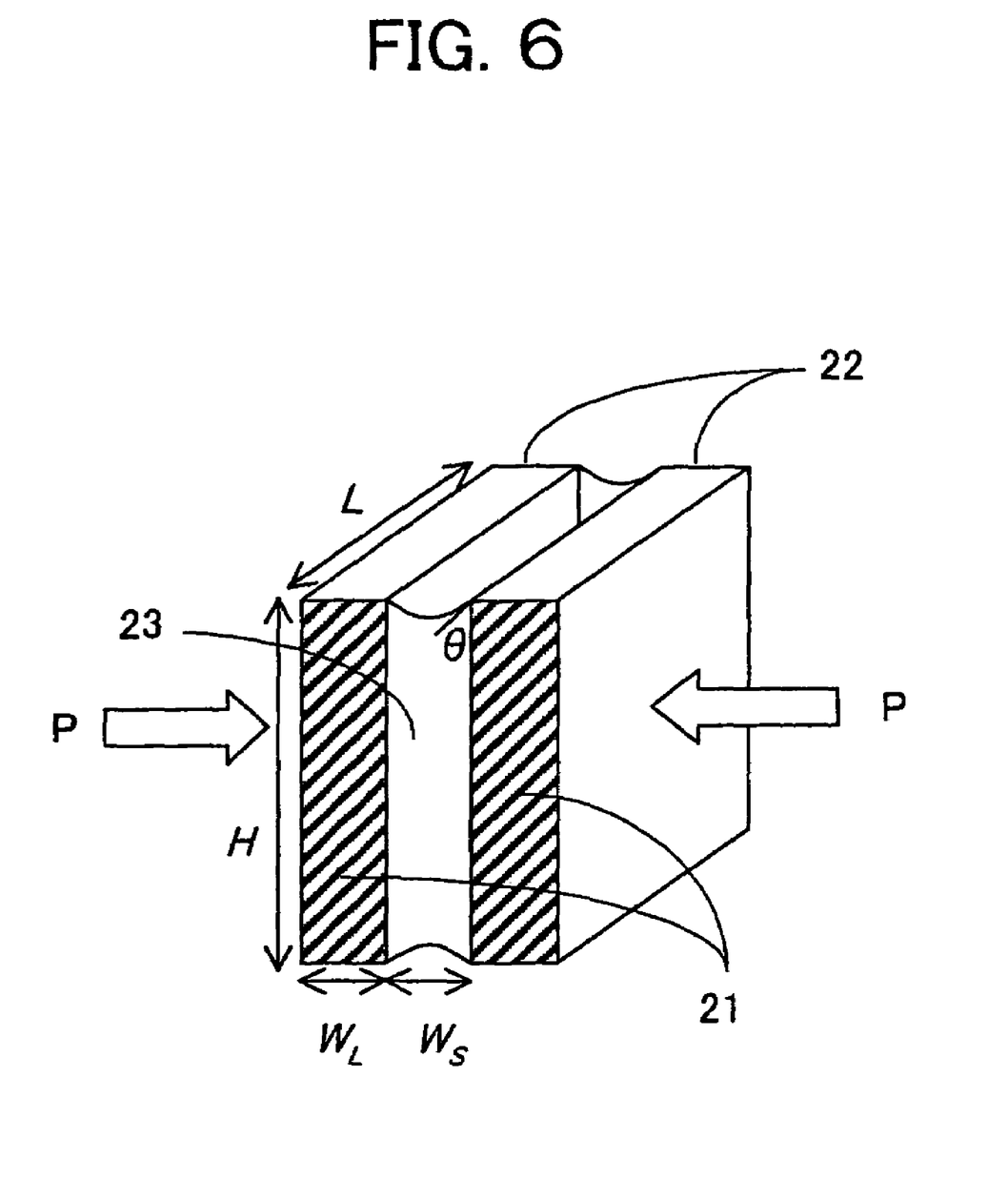
FIG. 6 is a view showing steps loaded to struts by a surface tension of liquid in the step of immersing mask to liquid or drying it.

A relative equation for determining the complementary division standard is calculated. In the step of wet washing, due to a water pressure variation causing by a convection current of liquid in a washing bath, a difference of pressures at liquid-vapor interface causing by the surface tension of liquid, and other various factors, the unaperture portions of the mask are considered to load. The load is assumed mainly surface tension of liquid;

FIG. 6 is a view showing a step loaded to the struts by the surface tension of liquid in the step immersing a mask in liquid or drying.

FIG. 6 is corresponding to the hatched portions of the line-and-space pattern in FIG. 4. The line-and-space pattern can be assumed corresponding to which the struts (beams) made by membrane having its width $W_L$ (the membrane region) are arranged at the distance $W_S$. The side portions 21 of the struts shown by the hatched portions are fixed by the surrounding membrane. The struts constituted with the line-and-space pattern are struts structure fixed both sides, so the other side portions 22 are fixed similarly to the hatched portion side.

The struts structure are loaded to the struts serving as the unaperture portions in wet washing of the mask and drying in maximum, when the region 23 between two struts is filled with liquid and the region outside thereof hardly ever filled with liquid. And then, the struts are acted with a pressure P in the arrow direction. This is because that if the both regions between the struts 23 are filled with liquid, the pressure is cancelled. The above pressure is indicated by the following equation (1).

$$P = \frac{2\gamma \cos\theta}{W_S} \qquad (1)$$

Note that, "$\gamma$" indicates the surface tension of liquid filled between the struts, "$\theta$" indicates a contact angle between the struts surface contacting liquid and liquid, and "$W_S$" indicates the distance between the struts shown in FIG. 6.

The maximum bending moment M occurring at the struts if considering the above pressure P as an uniform load is indicated by the following equation (2) if being the thickness H and the length L of the struts each other.

$$M = \frac{PHL^2}{12} \qquad (2)$$

The maximum stress $\sigma_{max}$ loaded to the struts is indicated by the following equation (3) based on the following equation (2) if the width of the struts is indicated by "$W_L$".

$$\sigma_{max} = \frac{P}{2}\left(\frac{L}{W_L}\right)^2 \qquad (3)$$

If the maximum stress $\sigma_{max}$ is larger than same threshold $\sigma_C$, that is, $\sigma_{max} > \sigma_C$, the struts may be deformed over an elastic deformation. As a result, the relation between the length L and width $W_L$ of the struts not deformed and the distance $W_S$ adjoining the struts is indicated by the following equation (4).

$$W_S > k_1 \times \left(\frac{L}{W_L}\right)^2 \qquad (4)$$

In the above equation, the coefficient $k_1$ is indicated by the following equation (5).

$$k_1 = \frac{\gamma \cos\theta}{\sigma_c} \quad (5)$$

If the length L of the struts is indicated by "$L_C$" when the maximum stress $\sigma_{max}$ is equal to the threshold $\sigma_C$, the conditional equation of the pattern length in that the maximum stress loaded to a film between the patterns, when wet washing, is equal to the elastic limit of the film in the width $W_L$ and the distance $W_S$ of the predetermined struts is indicated by the following equation (6).

$$W_S = k_1 \times \left(\frac{L_c}{W_L}\right)^2 \quad (6)$$

"$L_{UL}$" is multiplied with the suitably coefficient (safety coefficient) smaller than 1 by $L_C$, and is indicated by the following equation (7).

$$L_{UL} = A \times L_C \quad (7)$$
$$= A \times W_L \times \sqrt{\left(\frac{\sigma_C}{\gamma \cos\theta} \times W_S\right)}$$

The complementary division of the stencil mask is performed by making the above $L_{UL}$ as the maximum volume of L, as a result the stencil mask in that washing is difficulty caused with the deformation of the struts can be provided. The above equations are referred to the document (Namatsu et al. *Appl. Phys. Lett. Vol*66, p2656, 1995) explained with the load to the struts structure fixed one side, applied with the theory of the load to the struts structure fixed one side to the struts structure fixed both side, and calculated.

Step ST2

As above mentioned, the relative equation for the complementary division standard is calculated, then the coefficient $k_1$ of the above equation (5) is prepared by experiment in the struts structure fixed both side of the stencil mask. Because, the above coefficient $k_1$ is changed due to the Young's modulus of the membrane materials for using or a method of wet washing.

Therefore, the line-and-space pattern is formed on the membrane to produce a washing test sample so as to be able to prepare the limit length $L_C$ of the struts not deforming when washing. The structure of the washing test sample does not have to be equal to the membrane thickness or the membrane size of the structure of the stencil mask used for projection in practical. That is, the test sample may have the membrane materials same as the stencil mask used for projection and have a structure considered equally to the Young's modulus.

Figure 7A:
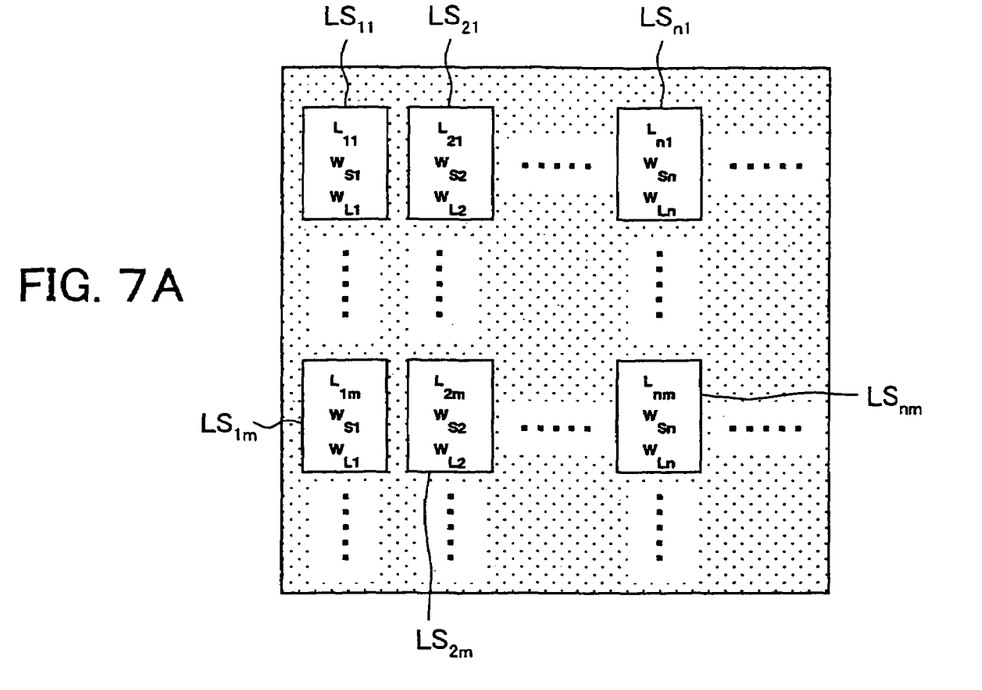
FIG. 7A is a view showing a structure of a washing test sample.

FIG. 7A is a view showing the structure of the washing test sample. The washing test sample is arranged with the line-and-space pattern $LS_{nm}$ (n=1, 2, ..., m=1, 2, ...) having various widths $W_L$, distances $W_S$, and lengths L in a matrix. The respective line-and-space patterns $LS_{nm}$ have four struts having the length $L_{nm}$, the width $W_{Ln}$, and the distance $W_{Sn}$, shown in FIG. 7B.

As shown in FIG. 7A, the washing test sample is formed with the line-and-space pattern having a plurality of pattern lengths $L_{nm}$ (m=1, 2, ..., $L_{nm} < L_{nm+1}$) in the respective n corresponding to the plurality pairs of the width and distances ({$W_L$, $W_S$}, n=1, 2, ...).

Figure 7B:
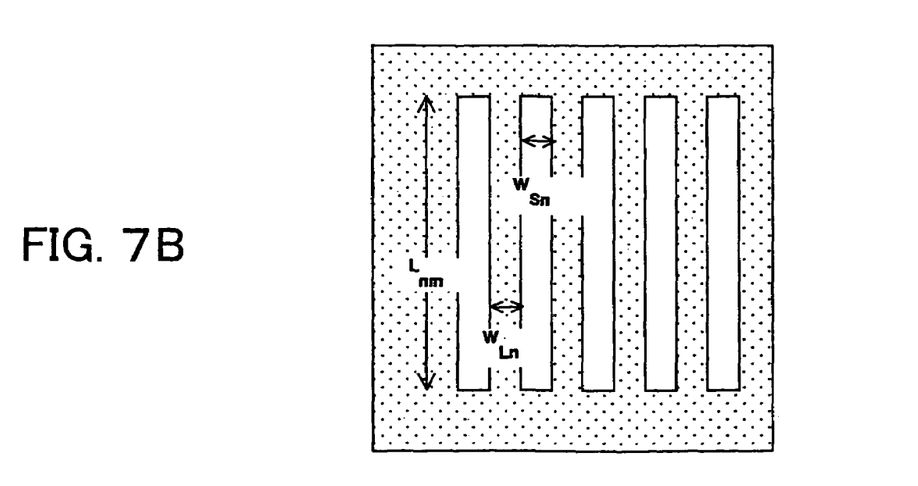
FIG. 7B is an enlarged view of the line-and-space pattern arranged at the washing test sample.

In the present embodiment, the pattern of the struts structure fixed both sides arranged with four struts shown in FIG. 7B is fixed with $W_L/W_S$ by 2, and is changed with $W_S$ within the limit of 70 to 200 nm and $L/W_S$ within the limit of 5 to 200 to form the sample on a silicon membrane of about 500 nm thickness and use.

Step ST3

Next, the test sample produced in the step ST2 is washed, and the boundary portions $L_{nm}=L_{nm}'$ between the pattern length $L_{nm}=L_{nm+1}'$ deformed with the pattern after washing and the pattern length $L_{nm}=L_{nm}'$ not deformed in the above respective pairs of {$W_{Ln}$, $W_{Sn}$} are prepared. The $L_{nm}'$ prepared by this is used and made $L_C=L_{nm}'$, then the coefficient $k_1$ is calculated by using the above equation (6).

In the present embodiment, the washing is performed at the following condition or possibly close to the condition when washing the stencil mask used for projection.

The washing apparatus is used with FL820L made by Dai Nippon Screen MFG. Co., Ltd. or UW8000 made by Tokyo Electron Limited. These two apparatus are performed with the steps from washing by the plurality of washes by water or rinse chemicals to drying in single bath, that is, one bath type apparatus in that the method of replacing from pure water to chemical or replacing from chemicals to pure water is not draining at once and pouring water, but can be replacing from the previously chemicals to others gradually by the over flow. The dry systems thereof are common in the point of using isopropyl alcohol (hereinafter, called as an "IPA"), but the former is utilizing the Marangoni effect by the difference of the surface tensions of IPA and water and drying by low pressure and the later is using IPA vapor drying by an atmospheric pressure, so these are different points.

The one bath type washing apparatus can be kept with sufficiently wettability and be exchanged with chemicals. So the number of times passing through liquid-vapor interface when washing sample, that is, caused with the stress at the struts due to the surface tension, are only two when immersing a sample first in liquid and drying. Due to this, comparing with the case of using numerous bath type wet washing apparatus or a spin type washing apparatus for general use (the number of times passing though the liquid-vapor interface are increasing), the pattern deformation can be considered to small. And the spin type washing apparatus is used with a spin drying method in general. If the spin drying method is applied to the stencil mask, the centrifugal force occurs adding to the surface tension, as a result, the factors deformed with a mask pattern are increasing, and so the stress loaded to the struts is considered to increasing.

The pulling rate and dipping rate of the sample when immersing the sample at the washing apparatus are set at the minimum rate able to self-convey in the respective apparatus. The flow rates for supplying liquid are set at two kinds of that one (1) is the minimum flow rate within the limit able to process automatically and the other (2) is the flow rate similarly to the real chemicals process. The washing process time is similaly to real chemical process. And the temperature of liquid is room tempreture, and chemicals is not used but only pure water is used.

Figure 8:
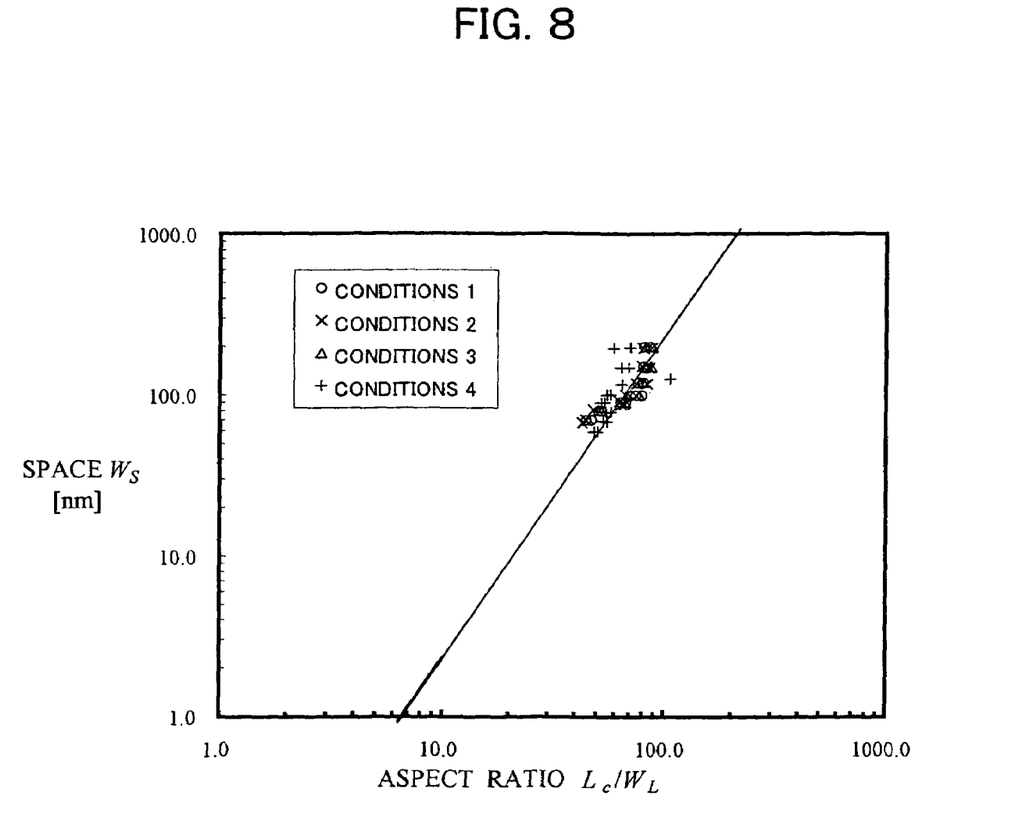
FIG. 8 is a view showing a result of an experiment when washing the test sample at a washing condition.

FIG. 8 shows an experimental result in the case of washing the test sample at the above washing condition. The following conditions 1 to 4 are plotted with the distance $W_S$ at y-axis and $(L_C/W_L)^2$ at x-axis. The difference of the conditions 1 to 4 and the coefficient $k_1$ calculated by parameter fitting will be mentioned hereinafter.

The condition 1 is case of using UW8000 as the washing apparatus and employing the above (1) as the flow rate for providing liquid, so the coefficient $k_1$ becomes 0.22. The condition 2 is a case of using UW8000 as the washing apparatus and employing the above (2) as the flow rate for providing liquid, so the coefficient $k_1$ becomes 0.24. The condition 3 is a case of using FL820L as the washing apparatus and employing the above (1) as the flow rate for providing liquid, so the coefficient $k_1$ becomes 0.23. The condition 4 is a case of using FL820L as the washing apparatus and employing the above (2) as the flow rate for providing liquid, so the coefficient $k_1$ becomes 0.23.

As mentioned above, the experiment used the washing apparatus using in particularly after the pattern formation at the stencil mask is satisfied with the strait-line relation shown in the above equation (6) in the respective conditions 1 to 4, therefore is shown that the assumption considered in the present embodiment is adequate.

Step ST4

Next, the complementary division standard, that is, the coefficient A and $L_{UL}$ in the above equation (7), is determined. $L_{UL}$ shown in the above equation (7) is a function of variables $W_S$ and $W_L$. And the method dividing the line-and-space pattern by a division length of $L_{UL}$ is determined whether the entire $\{W_S, W_L\}$ are applied to the same A (1) or applied to same $L_{UL}$ (2).

In the case of (1), for example, the value of the coefficient A such as A=0.6 is directly determined in advance. The pattern portions for complementary dividing are specified with the distances $W_S$ and the widths $W_L$ in the entire regions, then $L_{UL}$ are determined by the equation (7) in the respective $\{W_S, W_L\}$.

In the case of (2), $\{WS, WL\}$ considered the most critical condition to the pattern deformation by washing are sampled to determine $L_{UL}$ in that case, and applied with the same division length to the entire $\{W_S, W_L\}$ uniformity. Here, the critical condition is defined a condition of the width and the distance of the pattern that is assumed the pattern deformation over an elasticity limit is easiest given by wet washing, and corresponding to a condition the smallest width and distance in the pattern to be divided. For example, in the case of determining $\{W_S, W_L\}=\{70\ nm, 70\ nm\}$ and A=0.55, if the coefficient $k_1$=0.24 prepared in the step ST3 is substituted, $L_{UL}$ becomes about 2 μm. In particular, in the washing experiment of the step ST3, the pattern of $\{W_S, W_L\}=\{70\ nm, 70\ nm\}$ and L=2 μm is confirmed to not deform after washing.

The program according to the present embodiment is processed by computer with the complementary division process for dividing the line-and-space pattern at the complementary division condition determined like above.

Figure 9:
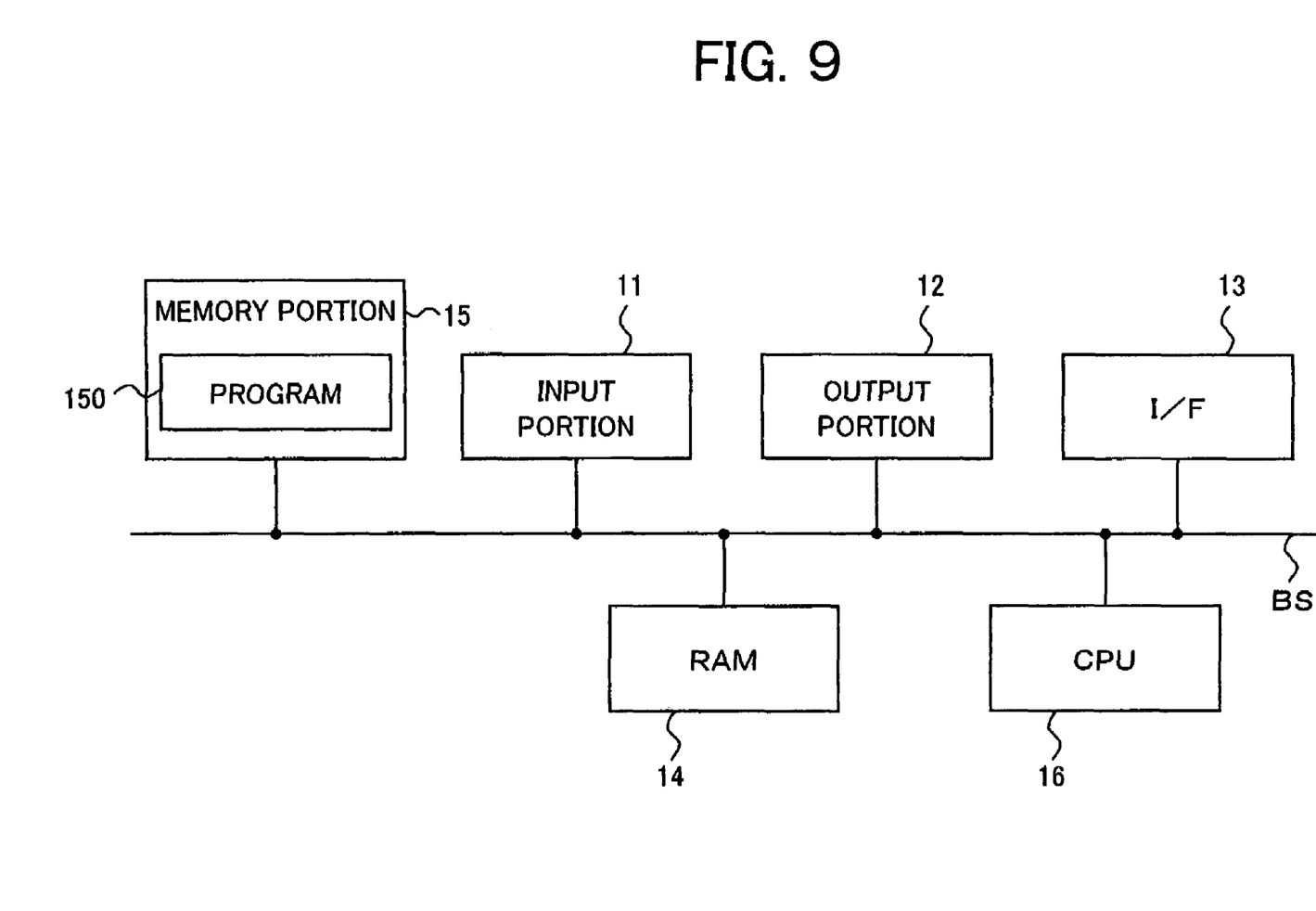
FIG. 9 is a block diagram showing an embodiment of hardware of a computer determining a complementary division condition by reading a program according to the present embodiment.

FIG. 9 is a block diagram showing an embodiment of hardware of a data processing apparatus (computer) determining the complementary division condition by reading the program according to the present embodiment.

The data processing apparatus has an input portion 11, an output portion 12, an interface (I/F) 13, a random access memory (RAM) 14, a memory portion 15, and a central processing unit (CPU) 16. And the input portion 11, the output portion 12, the I/F 13, the RAM 14, the memory portion 15, and the CPU 16 are connected by a bus BS.

The input portion 11 outputs a desired input data to the CPU 16. For example, the input portion 11 is a keyboard, a mouse, a compact disc type read-only memory (CDROM) (recordable (R) or rewritable (RW)) drive, a floppy (a registered trademark) disk (FD) drive, or other input apparatus.

The output portion 12 supplies data corresponding to a desired output data outputted from the CPU 16. For example, the output portion 12 is a display device and displays an image corresponding to output data outputted from the CPU 16. The I/F 13 transmits and receives a desired data to the other data processing apparatus according to control of the CPU 16.

The RAM 14 is used as a workspace when the CPU 16 performs the predetermined process. The memory portion 15 writes and reads the desired data by the CPU 16.

The memory portion 15 is housed with a program 150 according to the present embodiment for example. The program 150 includes the processing step of the complementary division process according to the present invention for example, and is performed at the RAM 14 as a workspace by the CPU 16.

Figure 10:
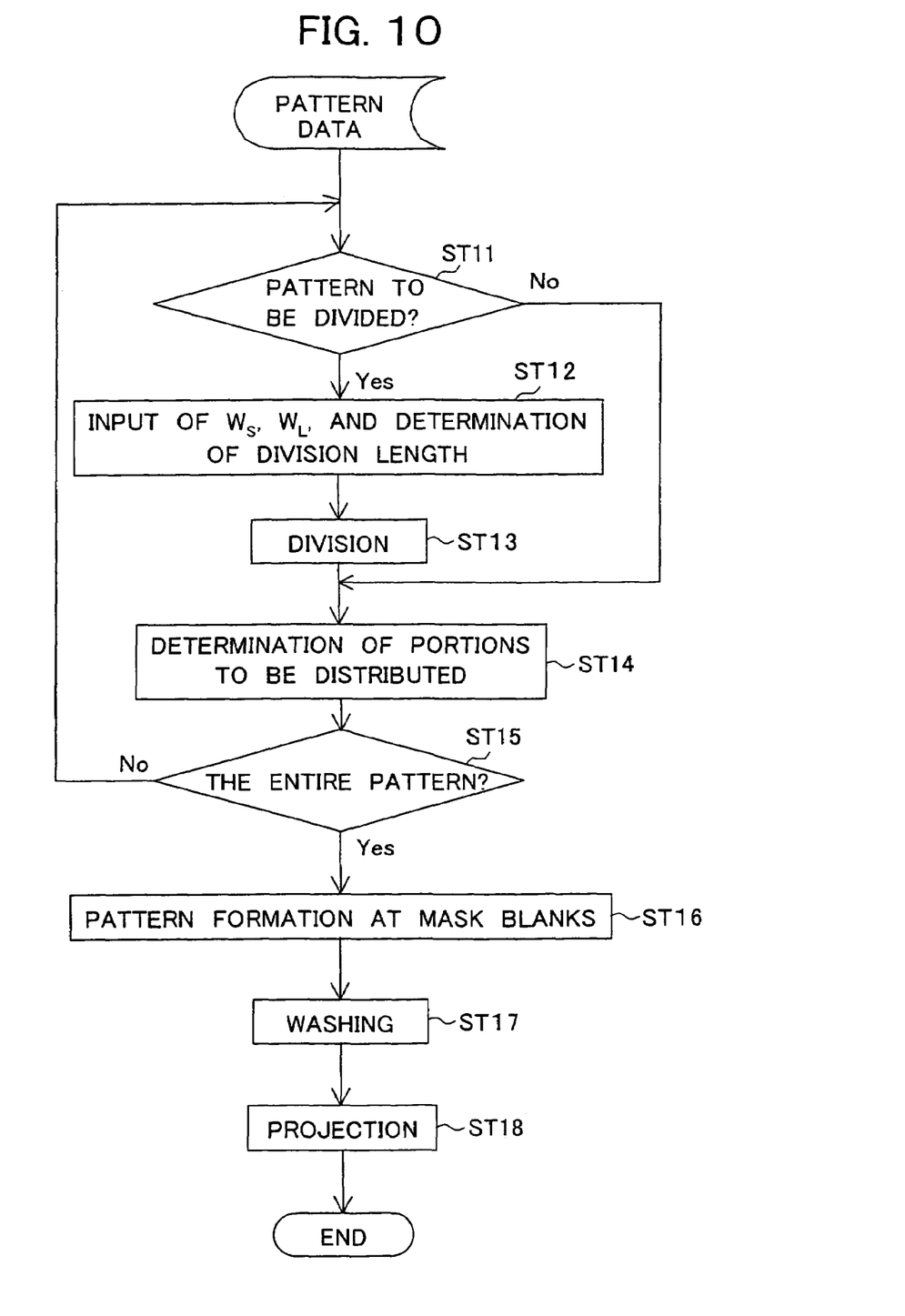
FIG. 10 is a flow chart of a complementary division process according to the present embodiment.

FIG. 10 is a flow chart of the complementary division process performed by the above program. Here, the complementary division standard will be explained in the case of employing the above (1) method.

First, a pattern is sampled from a designed pattern data, and estimated whether the sampled pattern is a pattern to be divided or not (step ST11). The pattern to be divided includes not only the line-and-space pattern, but also the above doughnut pattern and a leaf pattern, so if being these patterns, the respective suitable complementary division processes are performed. If not being the pattern to be divided, the division processes are not performed and portions to be distributed are determined (step ST14).

Figure 11A:
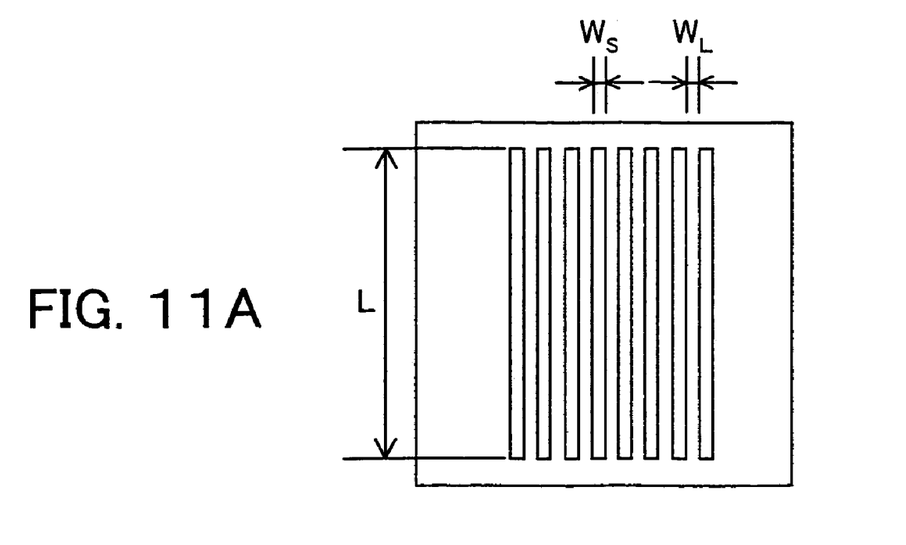
FIG. 11A to FIG. 11C are views explaining an example of division of the line-and-space pattern.

When the sampled pattern is the line-and-space pattern shown in FIG. 11A, the $W_L$ and $W_S$ of the line-and-space pattern are specified, then the division length $L_{UL}$ is calculated by the equation (7) and the vale of A (step ST12). That is, the $W_L$ and $W_S$ are substituted to the equation (7) to calculate the $L_{UL}$, or a compensation table is prepared in advance and the $W_L$ and $W_S$ are specified to determine the $L_{UL}$ satisfied with the equation (7).

Figure 11B:
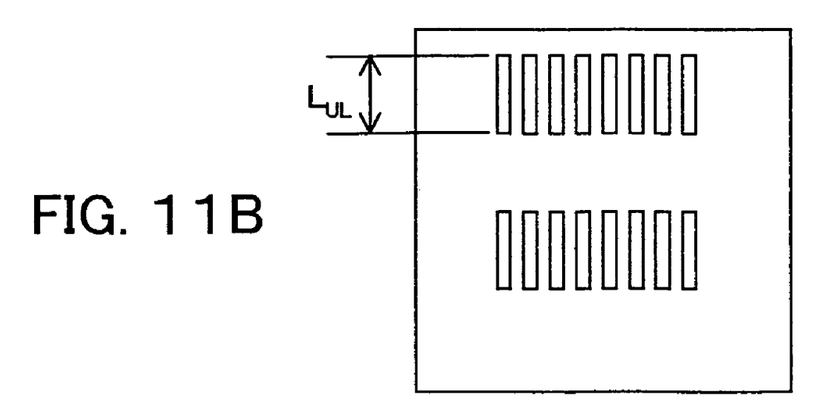
Figure 11C:
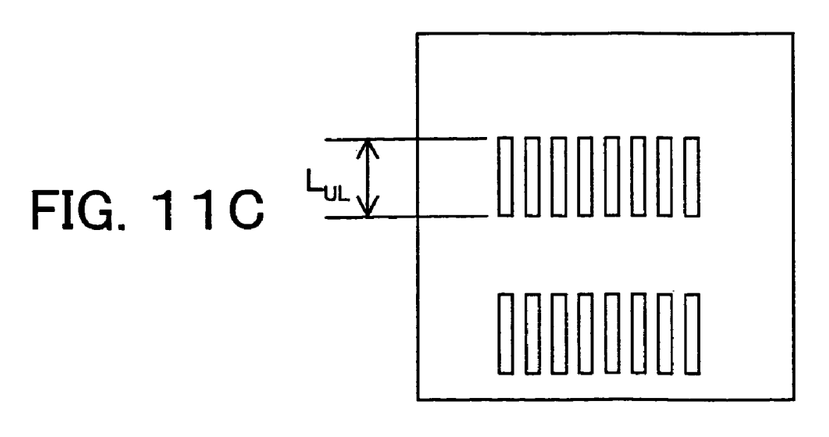

The line-and-space pattern is divided at the division length determined like above (step ST13), and the divided pattern is determined with the portion to be distributed (step ST14). In basically, in the region enabling pattern formation shown in FIG. 3, the divided pattern is distributed so as to have uniformity density. Therefore, the line-and-space pattern shown in FIG. 11A is distributed into the division pattern shown in FIG. 11B and the division pattern shown in FIG. 11C as a pair at the any portions enabling pattern formation.

The processes from the above step ST11 to the step ST14 are performed to the entire patterns including the pattern data (step ST15). After finishing the complementary division processes for the entire patterns, an electron beam directly describing apparatus describes a complementary division pattern at a mask blanks formed with a resist on the membrane 3 using complementary divided data. Then, the resist is developed, and the membrane is etched using the resist pattern as an etching mask to form apertures of the complementary division pattern at the mask blanks (step ST16).

After that, the resist is removed, and the stencil mask is washed by wet washing similarly to the above washing experiment to finish a process of producing the stencil mask. The wafer formed with the resist is exposed with shifting the stencil mask at several times, so the wafer is jointly transferred with the division pattern divided complementary to form the pattern before dividing (step ST18).

The complementary division process shown in FIG. 10 shows an example dividing according to the complementary division standard shown in case (1), but the complementary division standard shown in case (2) may be used. In this case, the step ST12 is not performed and the sampled line-and-space pattern is applied with uniformity division length. For example, the entire line-and-space pattern is divided in the longitudinal direction at the division length of 2 μm. The subsequent steps are similarly to the mention above.

In the complementary division method according to the present embodiment, the line-and-space pattern is determined with a rule for determining the division length able to suppress the pattern deformation when wet washing in advance, determined with the suitable division length in each time according to the width and distance of the pattern of the respective line-and-space pattern, and divided in the longitudinal direction. Therefore, the line-and-space can be suitably divided by simple algorithm.

On the other hand, in the designed pattern, the width and distance of the pattern that is assumed the pattern deformation over the elasticity limit is easiest given by wet washing are determined with the definite division length able to suppress the pattern deformation when wet washing, then the entire line-and-space patterns are divided at the determined division length in the longitudinal direction. As a result, the line-and-space patterns can be suitably divided by simpler algorithm.

The result obtained by the test sample is applied to a theory of the load to the struts structure fixed both sides, so the rule for determining the above division length or the suitable division length is calculated. As a result, the washing destruction of the stencil mask in practical can be suppressed certainly.

Therefore, the method of producing the stencil mask applied with the above complementary division method can suppress a washing destruction of the stencil mask, so can produce the stencil mask having reliability with no pattern deformation.

Summarizing the effects of the invention, the pattern deformation by wet washing of the stencil mask can be suppressed.

Note that, in the present embodiment, the coefficient $k_1$ is prepared by the experiment, but may be prepared by using the values of γ, θ, and $σ_c$ prepared from documents or by experiment each other.

While the invention has been described with reference to specific embodiments chosen for purpose of illustration, it should be apparent that numerous modifications could be made thereto by those skilled in the art without departing from the basic concept and scope of the invention.

What is claimed is:

1. A complementary division method for dividing a pattern comprising a plurality of apertures having a length in a first direction formed in a mask, comprising a step of dividing the pattern, in a second direction normal to the first direction, into a first portion of consecutive apertures and a second portion of consecutive apertures that are separated by a division length that is able to suppress a deformation of the patter when wet washing,
wherein the division length is determined by
washing a test sample mask having a preliminary division length based on a calculated relative equation for a complementary division of the mask, and calculating the division length by taking into consideration a resultant division length of the washed test sample mask.

2. A complementary division method as set forth in claim 1, comprising the steps of:
determining said division length of said pattern according to a width and distance of said pattern, said division length being defined as the maximum stress loaded to a film between said patterns that is not over an elasticity limit of said film when wet washing; and
dividing said pattern by said division length according to said width and distance of said pattern in said longitudinal direction.

3. A complementary division method as set forth in claim 1, comprising the steps of:
determining said division length of said patterns at a pattern having the smallest width and distance in said pattern to be divided, said division length being defined as the maximum stress loaded to a film between said patterns that is not over an elasticity limit of said film when wet washing; and
dividing the entire patterns by said division length in said longitudinal direction.

4. A complementary division method as set forth in claim 3, wherein said division length is no more than 2 μm.

5. A method of producing a mask comprising the steps of:
sampling a pattern comprising a plurality of apertures having a length in a first direction and dividing said sampled pattern, in a second direction normal to the first direction, into a first portion of consecutive apertures and a second portion of consecutive apertures that are separated by a division length that is able to suppress a deformation of the patter in the second direction of the pattern when wet washing, wherein the division length is determined by
washing a test sample mask having a preliminary division length based on a calculated relative equation for a complementary division of the mask, and calculating the division length by taking into consideration a resultant division length of the washed test sample mask;
distributing said divided patterns to difference regions to determine an arrangement of said divided patterns;
forming the first portion and the second portion of apertures of said divided patterns based on the determined arrangement of said divided patterns at the different regions of a mask blank; and
wet-washing a mask formed with said first portion and second portion of apertures.

6. A method of producing a mask as set forth in claim 5, comprising the steps of:
determining a division length of said pattern according to a width and distance of said pattern, said division length being defined as the maximum stress loaded to a film between said patterns that is not over an elasticity limit of said film when wet washing; and
dividing said pattern by said division length according to said width and distance of said pattern to be divided in said second direction.

7. A method of producing a mask as set forth in claim 5, comprising the steps of:
determining said division length of said patterns with a pattern having the smallest width and distance in said pattern to be divided; and
dividing the entire patterns to be divided by said division length in said second direction.

8. A method of producing a mask as set forth in claim 7, wherein said division length is no more than 2 μm.

9. A program processed in a computer for making a complementary division process for dividing a pattern comprising apertures having a length in a first direction formed at a mask, wherein a division length of said pattern is determined according to a width and distance of said pattern, said division length being defined as the maximum stress loaded to film between said pattern that is not over an elasticity limit of said film when wet washing, said program comprising the following steps processed by the computer:

sampling a pattern to be divided from a designed pattern;

determining said division length by washing a test sample mask having a preliminary division length based on a calculated relative equation for a complementary division of the mask, calculating the division length by taking into consideration a resultant division length of the washed test sample mask; and dividing said sampled pattern to be divided, in a second direction normal to the first direction, in to a first portion of consecutive apertures and a second portion of consecutive apertures that are separated by said determined division length in said second direction of the pattern.

10. A program processed in a computer making a complementary division process for dividing a pattern comprising apertures having a length in a first direction formed at a mask, wherein a division length of a pattern having the smallest width and distance in the pattern to be divided is determined, said division length being defined as that the maximum stress loaded to film between said patterns is not over an elasticity limit of said film when wet washing, said program comprising the following steps processed by the computer of:

sampling said pattern to be divided from a designed pattern; and dividing said sampled pattern to be divided, in a second direction normal to the first direction, into a first portion of consecutive apertures and a second portion of consecutive apertures that are separated, by said division length in said second directions wherein the division length is determined by washing a test sample mask having a preliminary division length based on a calculated relative equation for a complementary division of the mask.

calculating the division length by taking into consideration a resultant division length of the washed test sample mask.

11. A program as set forth in claim 10, wherein said division length is no more than 2 µm.

* * * * *